(12) United States Patent
Nakaoka

(10) Patent No.: US 10,255,954 B1
(45) Date of Patent: Apr. 9, 2019

(54) MEMORY DEVICE

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/951,183

(22) Filed: Apr. 12, 2018

(30) Foreign Application Priority Data

Dec. 5, 2017 (JP) .................................. 2014-233309

(51) Int. Cl.
    *G11C 7/10* (2006.01)
    *G11C 5/14* (2006.01)
    *G11C 5/06* (2006.01)

(52) U.S. Cl.
    CPC .............. *G11C 7/1057* (2013.01); *G11C 5/06* (2013.01); *G11C 5/14* (2013.01); *G11C 7/1084* (2013.01)

(58) Field of Classification Search
    CPC ........... G11C 7/1057; G11C 5/06; G11C 5/14; G11C 7/1084
    USPC ..................................................... 365/189.05
    See application file for complete search history.

(56) References Cited

U.S. PATENT DOCUMENTS

| 4,446,475 A * | 5/1984 | Gercekci .............. G06K 7/0095 235/487 |
| 7,391,634 B2 | 6/2008 | Kim et al. |
| 7,977,159 B2 | 7/2011 | Urakawa |
| 2012/0282735 A1* | 11/2012 | Ahn .................. H01L 21/76898 438/109 |

FOREIGN PATENT DOCUMENTS

| CN | 1318866 | 10/2001 |
| TW | 508805 | 11/2002 |

OTHER PUBLICATIONS

"Office Action of Taiwan Counterpart Application", dated Jun. 11, 2018, p. 1-p. 6.

* cited by examiner

*Primary Examiner* — Vu A Le
(74) *Attorney, Agent, or Firm* — JCIPRNET

(57) ABSTRACT

A memory device is provided. The memory device includes a first chip and a second chip. The first chip includes a first memory array, a first signal buffer and a plurality of first pads. The second chip includes a second memory array, a second signal buffer and a plurality of second pads. The second signal buffer is coupled to the first signal buffer by at least one connection wire, and the at least one connection wire passes through a scribe line between the first chip and the second chip. When the scribe line between the first chip and the second chip is not cut, signals are transmitted between the first signal buffer and the second signal buffer via the at least one connection wire, and the first memory array and the second memory array are commonly connected to the first pads and not connected to the second pads.

12 Claims, 5 Drawing Sheets

MEMORY DEVICE

CROSS-REFERENCE TO RELATED APPLICATION

This application claims the priority benefit of Japan application serial no. 2017-233309, filed on Dec. 5, 2017. The entirety of the above-mentioned patent application is hereby incorporated by reference herein and made a part of this specification.

BACKGROUND OF THE INVENTION

1. Field of the Invention

The invention relates to a memory device technique, and more particularly, to a memory device for determining a storage capacity by whether a scribe line between chips is cut.

2. Description of Related Art

The existing memory devices are all manufactured by semiconductor process, and the memory devices include, for example, a dynamic random access memory (DRAM), a static RAM (SRAM), a flash memory and a pseudostatic RAM (PSRAM). These memory devices are usually provided as products in different sizes (i.e., different storage capacities, from 8M to 128M) for allowing consumer electronics to dispose based on demands.

However, each of the memory products in different sizes normally require an independent research and development time, an unique mask device for each memory product, and use of different semiconductor processes. In other words, modifying the storage capacities of the memory products will consume a considerable amount of the research and development time thereby increasing manufacturer's research and development costs.

Accordingly, finding a way to manufacture the memory devices having different storage capacities by utilizing the same semiconductor manufacturing process and the same mask device is one of the directions that manufacturers make great efforts to study.

SUMMARY OF THE INVENTION

Accordingly, the invention provides a memory device, which is capable of adjusting a storage capacity of the memory device according to whether a scribe line between two adjacent chips is cut.

the memory arrays and the related circuits are disposed on two adjacent chips in the memory device of the invention, and the signal buffers are disposed on the two chips, respectively. The two signal buffers are connected by the at least one connection wire, and the connection wire passes through the scribe line between the first chip and the second chip. When the scribe line between the two chips is not cut, because the connection wire can normally transmit the signals between the two signal buffers, the storage capacities of the two chips may be added together through signal operation, and the operation of the memory device may be realized by connecting to the pads of only one of the chips. Conversely, when the scribe line between the two chips is cut, because the connection wire is also cut, the two ends of the connection wire are floating, and thus the memory devices on the two chips can only operate on their own and the storage capacity cannot be increased. In other words, the memory device of the invention can adjust the storage capacity of the memory device according to whether the scribe line between the two adjacent chips is cut. Moreover, according to the embodiments of the invention, the signal buffers with special design may be utilized to allow the memory device to operate normally even if some of connection points are floating.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
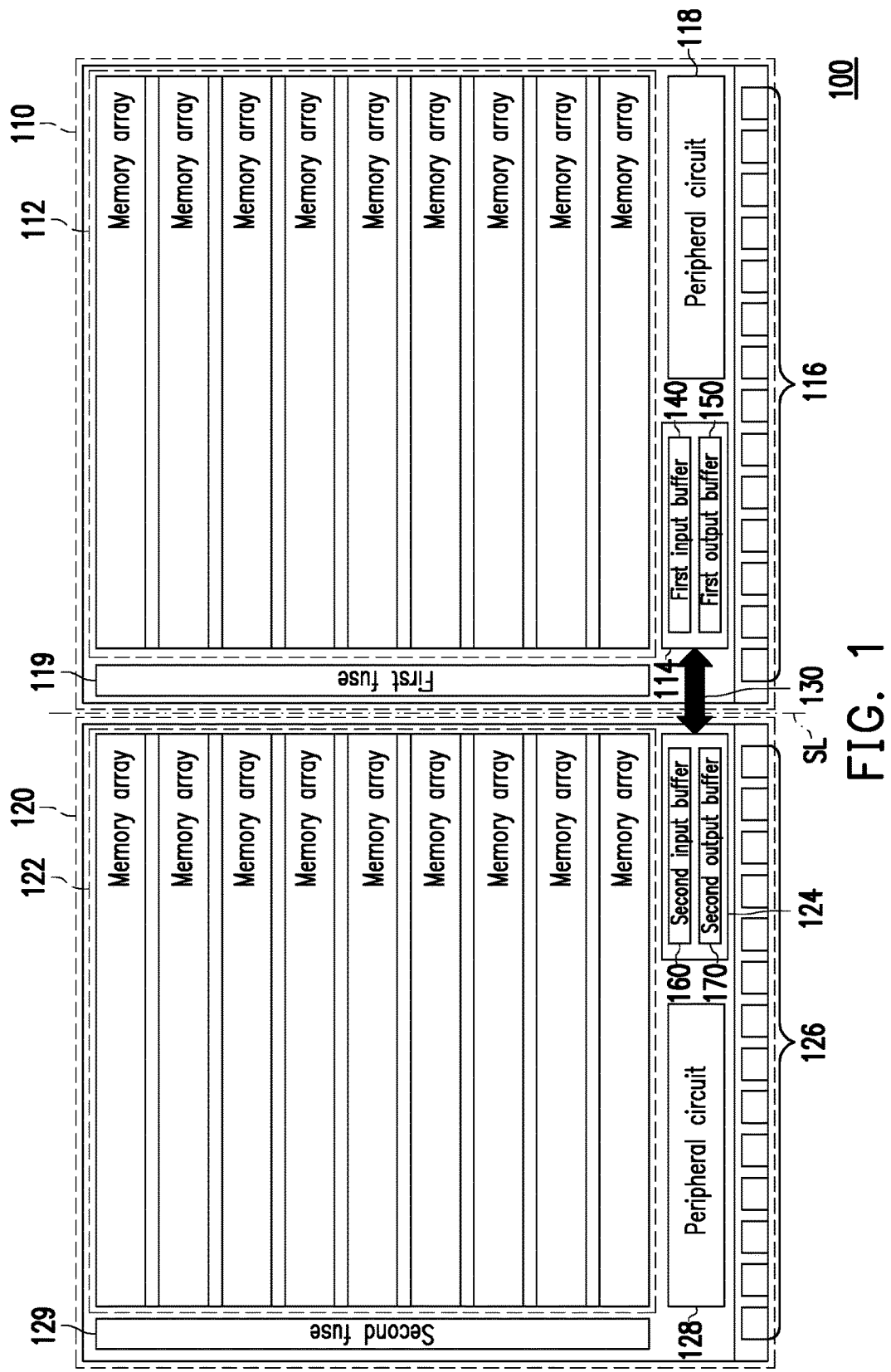
FIG. 1 is a block diagram illustrating a memory device according an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram illustrating a memory device 100 according an embodiment of the invention. The memory device 100 includes a first chip 110 and a second chip 120. and a scribe line SL is provided between the first chip 110 and the second chip 120. The first chip 110 mainly includes a first memory array 112, a first signal buffer 114 and a plurality of first pads 116 and may also include a peripheral circuit 118 and a first fuse 119. The second chip 120 mainly includes a second memory array 122, a second signal buffer 124 and a plurality of second pads 126 and may also include a peripheral circuit 128 and a second fuse 129.

The first signal buffer 114 is coupled to the second signal buffer 124 by at least one connection wire 130. A connection wire voltage VDD, a ground voltage VSS and various internal signals of the first chip 110 and the second chip 120 are interconnected and transmitted via the connection wire 130. An input connection wire CE_AB in FIG. 2 and an output connection wire DATi_AB in FIG. 3 are a part of the connection wire 130. The connection wire 130 passes through the scribe line SL between the first chip and the second chip. A disposed location of the connection wire 130 passes through a location of the scribe line SL. In other words, when the scribe line SL is cut and separated, the connection wire 130 is cut to enter a floating state. Further, the connection wire 130 may be realized by aluminum or copper. The location of the scribe line SL and a disposed location of the first pads 116 are located at different positions on the chip, and the location of the scribe line SL and a disposed location of the second pads 126 are located at different positions on the chip.

In the present embodiment, the disposed location of the first pads 116 and the disposed position of the second pads 126 may be disposed at the same position of the first chip 110 and the second chip 120. The first pads 116 and the second pads 126 may include a plurality of pads for accessing various information from the outside, such as a power voltage VDD, a memory data ADQi (e.g., ADQ0 to ADQ7), a clock signal CLK, an access signal CE, a ground voltage VSS, etc.

Each of the first memory array 112 and the second memory array 122 includes a plurality of memory arrays (such as multiple memory arrays shown in FIG. 1). The peripheral circuit 118 and the peripheral circuit 128 may also include memory address decoders for the memory arrays 112 and 122. In the present embodiment, the first memory array 112 and the second memory array 122 are implemented by using the pseudostatic RAM (PSRAM) with 32M, for example. Person who applies the present embodiment can adjust storage capacities of the first memory array 112 and the second memory array 122 based on demands, which is adjustable in a range of 8M to 128M. or in other forms, such as the dynamic random access memory (DRAM), the static random access memory (SRAM) or the flash memory, without departing from the spirit of the embodiments of the invention.

If it is desired to obtain the PSRAM having a doubled storage capacity (e.g., by combining a capacity of 32M as included by each memory array on the two chips into 64M (32M multiplied by 2)), the present embodiment may be used to cut the first chip 110 and the second chip 120 on the wafer as a whole without cutting the scribe line SL When the scribe line SL is not cut, the first signal buffer 114 and the second signal buffer 124 can transmit multiple internal signals via the connection wire 130 so the memory arrays on the two chips may all be used. Therefore, the first chip 110 and the second chip 120 may be regarded as the same chip for realizing the memory device 100 with 64M PSRAM.

Because the first signal buffer 114 and the second signal buffer 124 can transmit signals to each other, it is only required that the first memory array 112 and the second memory array 122 are commonly connected to the first pads 160 instead of being connected the second pads 126 also. In other words, when the scribe line is not cut, it is only required to perform a ponding pad on the first pads 116 without performing the ponding pad on the second pads 126 in the present embodiment. In addition, in order to realize the memory device 100 with 64M PSRAM, the first fuse 119 and the second fuse 129 are set to a cut-off state (i.e., the first fuse 119 and the second fuse 129 are burnt-out) in the present embodiment, such that a first fuse signal obtained by the first signal buffer 114 and a second fuse signal obtained by the second signal buffer 124 are set to logic high (i.e., logic "1").

On other hand, if it is desired to obtain the memory device with the storage capacity of one PSRAM (i.e., the PSRAM with the storage capacity of 32M), a cutting process may be conducted along a periphery of the first chip 110 and a periphery of the second chip 120 on the wafer as well as on the scribe line SL, such that the first chip 110 and the second chip 120 are separated into different chips. When the scribe line SL is cut, the connection wire 130 between the first signal buffer 114 and the second signal buffer 124 is unable to transmit the signals. Accordingly, the 32M PSRAM on the first chip 110 and the 32M PSRAM on the second chip 120 are used as independent memory devices. Further, to realize two memory devices with 32M PSRAM, in the case where the first chip 110 and the second chip 120 are independent individuals, the ponding pad is performed on each of the first pads 116 and the second pads 126, so the memory arrays on the two chips can operate through the first pads and the second pads, respectively. In the present embodiment, the first fuse 119 and the second fuse 129 are set to a turned-on state (i.e., the first fuse 119 and the second fuse 129 are not burnt-out), such that the first fuse signal obtained by the first signal buffer 114 and the second fuse signal obtained by the second signal buffer 124 are set to logic low (i.e., logic "0").

The first signal buffer 114 includes a first input buffer 140 and a first output buffer 150. The second signal buffer 124 includes a second input buffer 160 and a second output buffer 170. The first input buffer 140 corresponds to the second input buffer 160, and the first output buffer 150 corresponds to the second output buffer 170. Herein, the first input buffer 140 and the second input buffer 160 are described in detail with reference to FIG. 2, and the first output buffer 150 and the second output buffer 170 are described in detail with reference to FIG. 3.

Figure 2:
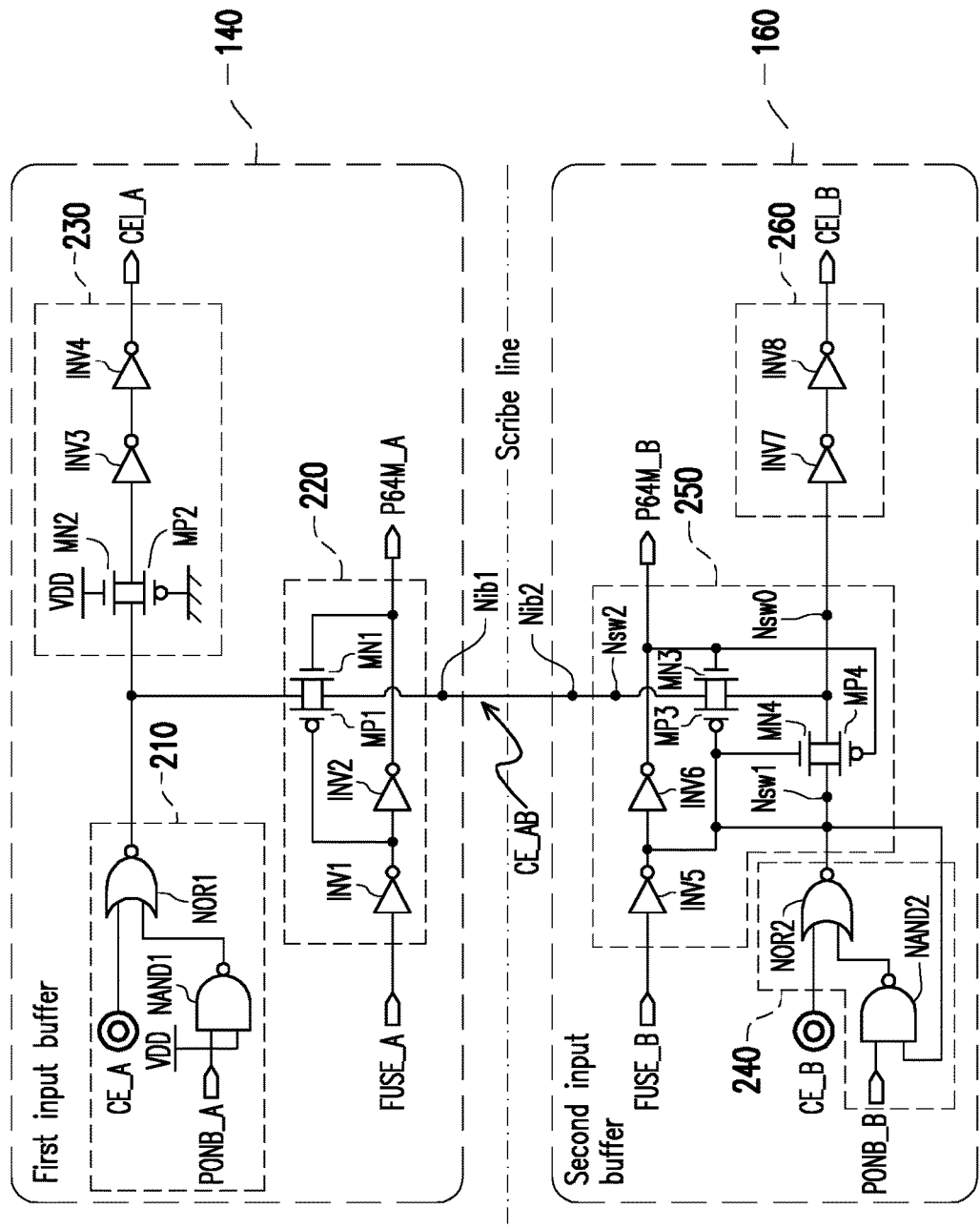
FIG. 2 is a circuit diagram of a first input buffer and a second input buffer in FIG. 1.
Figure 3:
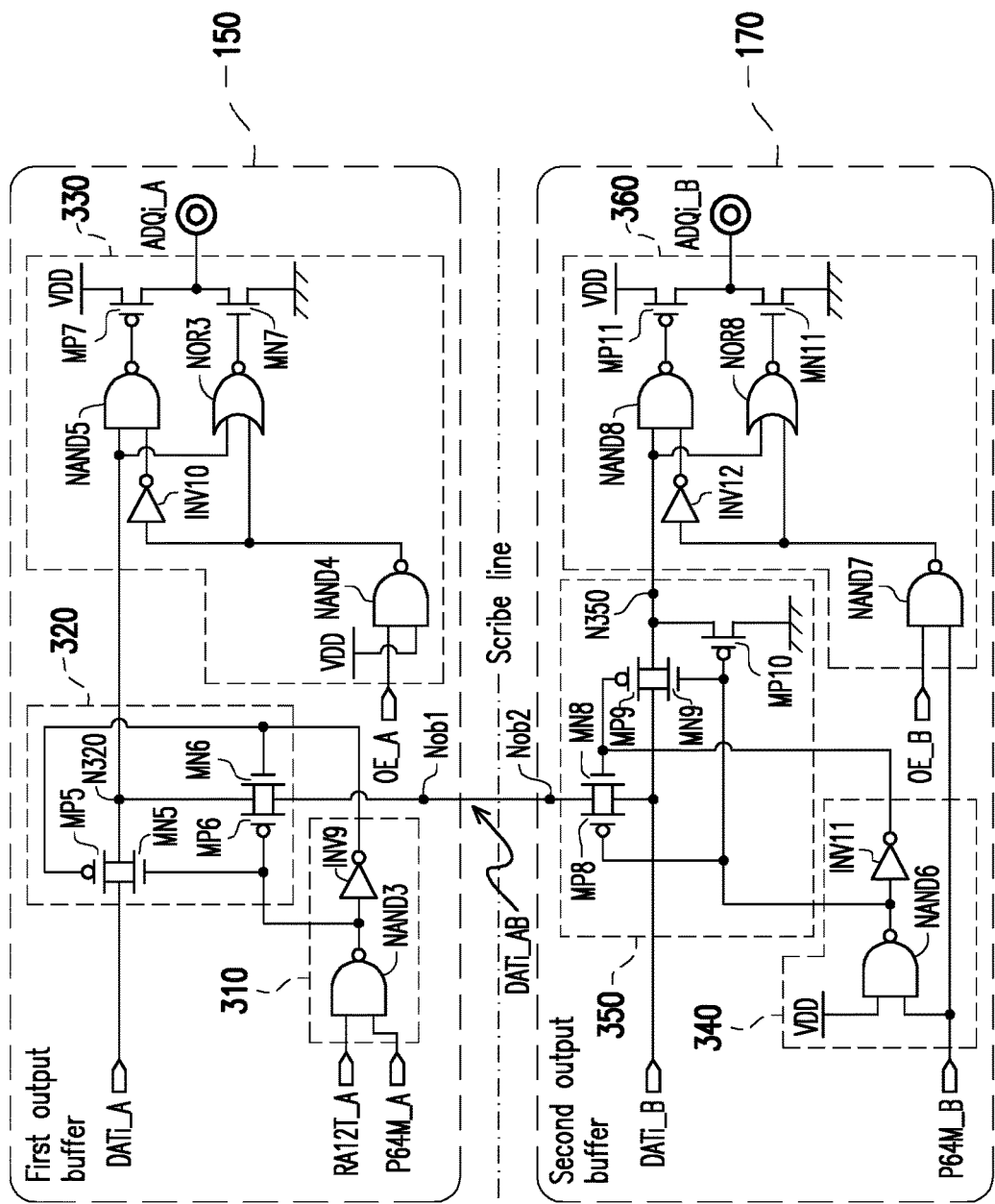
FIG. 3 is a circuit diagram of a first output buffer and a second output buffer in FIG. 1.

FIG. 2 is a circuit diagram of the first input buffer 140 and the second input buffer 160 in FIG. 1. An output terminal of the first input buffer 140 generates a first memory control signal CEI_A for controlling the first memory array 112 in FIG. 1, and an output terminal of the second input buffer 160 generates a second memory control signal CEI_B for controlling the second memory array 122 in FIG. 1. The first input buffer 140 is coupled to one end of an input connection wire CE_AB by a first input buffer terminal Nib1. The second input buffer 160 is coupled to another end of the input connection CE_AB wire by a second input buffer terminal Nib2. When the scribe line SL is not cut, the first input buffer 140 determines to transmit a first access signal CE_A to the first input buffer terminal Nib1 according to a first fuse signal FUSE_A (i.e., the first fuse signal FUSE_A is at logic high). The second input buffer 160 determines to transmit the first access signal CE_A transmitted by the input connection wire CE_AB from the second input buffer terminal Nib2 to the output terminal of the second input buffer 160 according to a second fuse signal FUSE_B (i.e., the second fuse signal FUSE_B is at logic high). As such, the first memory control signal CEI_A and the second memory control signal CEI_B are both identical to the first access signal CE_A. The first access signal CE_A is transmitted to the first input buffer 140 via the first pads 116 in FIG. 1.

On the other hand, when the scribe line SL is cut, the first input buffer 140 transmits the first access signal CE_A received by the first pads 116 in FIG. 1 to the output terminal of the first input buffer to serve as the first memory control signal CEI_A. The second input buffer 160 transmits the second access signal CE_B received by the second pads 126 in FIG. 1 to the output terminal of the second input buffer 160 to serve as the second memory control signal CEI_B.

The first input buffer 140 includes a first logic circuit 210, a first input switch 220 and a first buffer circuit 230. The first logic circuit 210 includes a first NAND gate NAND1 and a first NOR gate NOR1. A first terminal of the first NAND gate NAND1 serves as a first terminal of the first logic circuit 210 for receiving a first activate signal PONB_A, and a second terminal of the first NAND gate NAND1 receives the power voltage VDD. A first terminal of the first NOR gate NOR1 serves as a second terminal of the first logic circuit 210 to be coupled to the first access signal CE_A. A second terminal of the first NOR gate NOR1 is coupled to an output terminal of the first NAND gate NAND1, and an output terminal of the first NOR gate NOR1 serves as an output terminal of the first logic circuit 210.

The first input switch 220 includes a first inverter INV1, a second inverter INV2, a first N-type transistor MN1 and a first P-type transistor MP1. An input terminal of the first inverter INV1 serves as a control terminal of the first input switch 220 for receiving the first fuse signal FUSE_A. An output terminal of the first inverter INV1 generates the first fuse signal being inversed. An input terminal of the second inverter INV2 is coupled to the output terminal of the first inverter INV1. An output terminal of the second inverter INV2 generates a first state signal P64M_A corresponding to the first fuse signal FUSE_A. A control terminal of the transistor MN1 is coupled to the output terminal of the second inverter INV2. A control terminal of the transistor MP1 is coupled to the output terminal of the first inverter INV1. A first terminal of the transistor MN1 and a first terminal of the transistor MP1 are both coupled to the output terminal of the first logic circuit 210 (i.e., the output terminal of the first NOR gate NOR1), and second terminals of the transistor MN1 and the transistor MP1 are both coupled to the first input buffer terminal Nib1.

The first buffer circuit 230 includes a second N-type transistor MN2, a second P-type transistor MP2, a third inverter INV3 and a fourth inverter INV4. A control terminal of the transistor MN2 receives the power voltage VDD, and a control terminal of the transistor MP2 is connected to ground. First terminals of the transistor MN2 and the transistor MP2 serve as an input terminal of the first buffer circuit 230 to be coupled to the output terminal of the first logic circuit 210. An input terminal of the third inverter INV3 is coupled to second terminals of the transistor MN2 and the transistor MP2. An input terminal of the fourth inverter INV4 is coupled to an output terminal of the third inverter INV3. An output terminal of the fourth inverter INV4 serves as the output terminal of the first input buffer 140 to generate the first memory control signal CEI_A. In this way, the first input buffer 140 can receive the first fuse signal FUSE_A to determine whether to interconnect a first terminal of the first input buffer 140 (i.e., the output terminal of the first NOR gate NOR1) and a second terminal of the first input buffer 140 (i.e., the first input buffer terminal Nib1).

The second input buffer 160 includes a second logic circuit 240, a second input switch 250 and a second buffer circuit 260. The second logic circuit 240 includes a second NAND gate NAND2 and a second NOR gate NOR2. A first terminal of the second NAND gate NAND2 serves as a first terminal of the second logic circuit 240 for receiving a second activate signal PONB_B, and a second terminal of the second NAND gate NAND2 is coupled to an output terminal of the second logic circuit 240 (i.e., an output terminal of the second NOR gate NOR2). A first terminal of the second NOR gate NOR2 serves as a second terminal of the second logic circuit 240 to be coupled to the second access signal CE_B. A second terminal of the second NOR gate NOR2 is coupled to an output terminal of the second NAND gate NAND2. An output terminal of the second NOR gate NOR2 serves as the output terminal of the second logic circuit 240.

The second input switch 250 includes a fifth inverter INV5, a sixth inverter INV6, a third N-type transistor MN3, a third P-type transistor MP3, a fourth N-type transistor MN4 and a fourth P-type transistor MP4. An input terminal of the fifth inverter INV5 serves as a control terminal of the second input switch 250 for receiving the second fuse signal FUSE_B. An output terminal of the fifth inverter INV5 generates the second fuse signal being inversed. An input terminal of the sixth inverter INV6 is coupled to the output terminal of the fifth inverter INV5. An output terminal of the sixth inverter INV6 generates a second state signal P64M_B corresponding to the second fuse signal FUSE_B. A control terminal of the transistor MN3 and a control terminal of the transistor MP4 are both coupled to the output terminal of the sixth inverter INV6. A control terminal of the transistor MP3 and a control terminal of the transistor MN4 are both coupled to the output terminal of the fifth inverter INV5. First terminals of the transistors MN3 and MP3 are coupled to the second input buffer terminal Nib2 to serve as a second terminal Nsw2 of the second input switch 250. Second terminals of the transistors MN3 and MP3 are coupled to an output terminal Nswo of the second input switch 250. First terminals of the transistors MN4 and MP4 are both coupled to the output terminal of the second logic circuit 240 (i.e., the output terminal of the second NOR gate NOR2) to serve as a first terminal Nsw1 of the second input switch 250. Second terminals of the transistors MN4 and MP4 are coupled to the output terminal Nswo of the second input switch 250. In this way, the second input switch 250 can selectively interconnect the first terminal Nsw1 of the second input switch 250 and the output terminal Nswo of the second input switch 250 or interconnect the second terminal Nsw2 of the second input switch 250 and the output terminal Nswo of the second input switch 250 according to the second fuse signal FUSE_B.

The second buffer circuit 260 includes a seventh inverter INV7 and an eighth inverter INV8. An input terminal of the seventh inverter INV7 serves as an input terminal of the second buffer circuit 260 to be coupled to the output terminal of the second input switch Nswo of the second input switch 250. An input terminal of the eighth inverter INV8 is coupled to an output terminal of the seventh inverter INV7. An output terminal of the eighth inverter INV8 serves as the output terminal of the second buffer circuit 260 to generate the second memory control signal CEI_B.

FIG. 3 is a circuit diagram of the first output buffer 150 and the second output buffer 170 in FIG. 1. An output terminal of the first output buffer 150 provides a first memory data signal DATi_A to one of the first pads 116. An output terminal of the second output buffer 170 provides a second memory data signal DATi_B to one of the second pads 126. The first output buffer 150 is coupled to the output connection wire DATi_AB by a first output buffer terminal Nob1. The second input buffer 170 is coupled to the output connection wire DATi_AB by a second output buffer terminal Nob2. When the scribe line SL is not cut, the second output buffer 170 determines to transmit the second memory data signal DATi_B to the second input buffer terminal Nob2 according to the second state signal P64M_B corresponding to the second fuse signal FUSE_B. The first output buffer 150 determines to transmit the first memory data signal DATi_A or the second memory data signal DATi_B transmitted by the output connection wire DATi_AB to the output terminal of the first output buffer 150 according to the first state signal P64M_A corresponding to the first fuse signal FUSE_A and a memory switch signal RA12T_A.

Conversely, when the scribe line SL is cut, the first output buffer 150 transmits the first memory data signal DATi_A to one of the first pads 116, and the second output buffer 170 transmits the second memory data signal DATi_B to one of the second pads 126.

The first output buffer 150 includes a third logic circuit 310, a first output switch 320 and a first output stage circuit 330. The third logic circuit 310 includes a third NAND gate NAND3 and a ninth inverter INV9. A first terminal of the third NAND gate NAND3 serves as a first terminal of the third logic circuit 310 for receiving the memory switch signal RA12T_A. A second terminal of the third NAND gate NAND3 serves as a second terminal of the third logic circuit 310 for receiving the first state signal P64M_A corresponding to the first fuse signal FUSE_A.

A first terminal of the first output switch 320 receives the first memory data signal DATi_A. A second terminal of the first output switch 320 is coupled to the first output buffer terminal Nob1. A control terminal of the first output switch 320 is coupled to an output terminal of the third logic circuit 310 for selectively interconnecting the first terminal of the first output switch 320 and an output terminal of the first output switch 320 or interconnecting the second terminal of the first output switch 320 (i.e., the first output buffer terminal Nob1) and the output terminal of the first output switch 320. The first output switch 320 includes a fifth N-type transistor MN5, a fifth P-type transistor MP5, a sixth N-type transistor MN6 and a sixth P-type transistor MP6. Control terminals of the transistor MN5 and the transistor MP6 are both coupled to an output terminal of the third NAND gate NAND3. Control terminals of the transistor MP5 and the transistor MN6 are both coupled to an output terminal of the ninth inverter INV9. First terminals of the transistor MN5 and the transistor MP5 receive the first memory data signal DATi_A. Second terminals of the transistor MN5 and the transistor MP5 are coupled to an output terminal N320 of the first output switch 320. First terminals of the transistor MN6 and the transistor MP6 are coupled to the output terminal N320 of the first output switch 320, and second terminals of the transistor MN6 and the transistor MP6 are both coupled to the first output buffer terminal Nob1.

The first output stage circuit 330 includes a fourth NAND gate NAND4, a tenth inverter INV10, a fifth NAND gate NAND5, a third NOR gate NOR3, a seventh N-type transistor MN7 and a seventh P-type transistor MP7. A first terminal of the fourth NAND gate NAND4 serves as a control terminal of the first output stage circuit 330 for receiving a first output enable signal OE_A. A second terminal of the fourth NAND gate NAND4 receives the power voltage. An input terminal of the tenth inverter INV10 is coupled to an output terminal of the fourth NAND gate NAND4. A first terminal of the fifth NAND gate NAND5 serves as an input terminal of the first output stage circuit 330 to be coupled to the output terminal N320 of the first output switch 320. A second terminal of the fifth NAND gate NAND5 is coupled to an output terminal of the tenth inverter INV10. A first terminal of the third NOR gate NOR3 is coupled to the output terminal N320 of the first output switch 320. A second terminal of the third NOR gate NOR3 is coupled to an output terminal of the fourth NAND gate NAND4. The transistor MN7 has a first terminal coupled to an output terminal of the first output stage circuit 330, a second terminal connected to ground and a control terminal coupled to an output terminal of the third NOR gate NOR3. The transistor MP7 has a first terminal coupled to the power voltage, a second terminal coupled to the output terminal of the first output stage circuit 330 and a control terminal coupled to an output terminal of the fifth NAND gate NND5. The output terminal of the first output stage circuit 330 serves as the output terminal of the first output buffer 150.

The second output buffer 170 includes a fourth logic circuit 340, a second output switch 350 and a second output stage circuit 360. The fourth logic circuit 340 includes a sixth NAND gate NAND6 and an eleventh inverter INV11.

A first terminal of the sixth NAND gate NAND6 serves as a first terminal of the fourth logic circuit 340 for receiving the power voltage VDD. A second terminal of the sixth NAND gate NAND6 serves as a second terminal of the fourth logic circuit 340 for receiving the second state signal P64M_B corresponding to the second fuse signal FUSE_B. An input terminal of the eleventh inverter INV11 is coupled to an output terminal of the sixth NAND gate NAND6.

The second output switch 350 includes an eighth N-type transistor MN8, an eighth P-type transistor MP8, a ninth N-type transistor MN9, a ninth P-type transistor MP9 and a tenth P-type transistor MP10. Control terminals of the transistor MN8 and transistor MP9 are coupled to the output terminal of the sixth NAND gate. Control terminals of the transistor MP8, the transistor MN9 and the transistor MP10 are all coupled to the output terminal of the sixth NAND gate NAND6. First terminals of the transistor MN8 and the transistor MP8 serve as a second terminal of the second output switch 350 to be coupled to the second output buffer terminal Nob2. Second terminals of the transistor MN8 and the transistor MP8 and first terminals of the transistor MN9 and the transistor MP9 all serve as a first terminal of the second output switch 350 for receiving the second memory data signal DATi_B. Second terminals of the transistor MN9 and the transistor MP9 are coupled to an output terminal N350 of the second output switch 350. A first terminal of the transistor MP10 is coupled to the output terminal N320 of the second output switch 350, and a second terminal of the tenth MP10 is connected to ground. In this way, the second output switch 350 can selectively interconnect the first terminal of the second output switch 350 (i.e., the second memory data signal DATi_B) and the output terminal N350 of the second output switch 350, or interconnect the first terminal of the second output switch 350 (the second memory data signal DATi_B) and the second terminal of the second output switch 350 (i.e., the second input buffer terminal Nob2) according to the second state signal P64M_B. When the first terminal and the second terminal of the second output switch 350 are interconnected, the second output switch 350 connects the output terminal N350 of the second output switch 350 to ground.

The second output stage circuit 360 includes a seventh NAND gate NAND7, a twelfth inverter INV12, an eighth NAND gate NAND8, a fourth NOR gate NOR4, an eleventh N-type transistor MN11 and an eleventh P-type transistor MP11. A first terminal of the seventh NAND gate NAND7 serves as a control terminal of the second output stage circuit 360 for receiving a second output enable signal OE_B. A second terminal of the seventh NAND gate NAND7 receives the second state signal P64M_B. An input terminal of the twelfth inverter INV12 is coupled to an output terminal of the seventh NAND gate NAND7. A first terminal of the eighth NAND gate NAND8 serves as an input terminal of the second output stage circuit 360 to be coupled to the output terminal N350 of the second output switch 350. A second terminal of the eighth NAND gate NAND8 is coupled to an output terminal of the twelfth inverter INV12. A first terminal of the fourth NOR gate NOR4 is coupled to the output terminal N350 of the second output switch 350. A second terminal of the fourth NOR gate NOR4 is coupled to an output terminal of the seventh NAND gate NAND7. The transistor MN11 has a first terminal coupled to an output terminal of the second output stage circuit 360, a second terminal connected to ground and a control terminal coupled to an output terminal of the fourth NOR gate NOR4. The transistor MP11 has a first terminal coupled to the power voltage VDD, a second terminal coupled to the output terminal of the second output stage circuit 360 and a control terminal coupled to an output terminal of the eighth NAND gate NAND8. The output terminal of the second output stage circuit 360 serves as the output terminal of the second output buffer 170.

Figure 4:
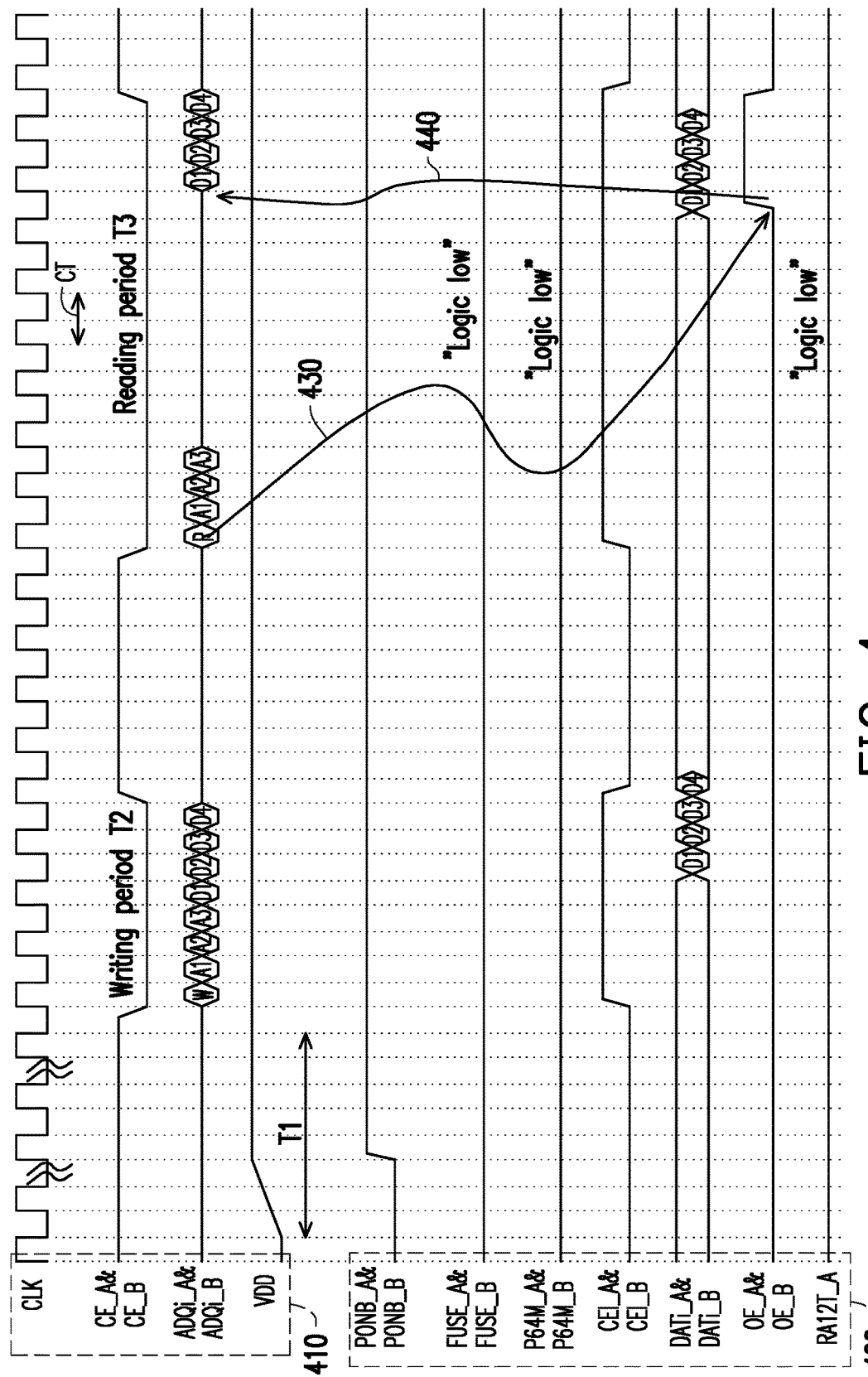
FIG. 4 is a waveform diagram illustrating operations of a first signal buffer and a second signal buffer when the scribe line is cut according an embodiment of the invention.
Figure 5:
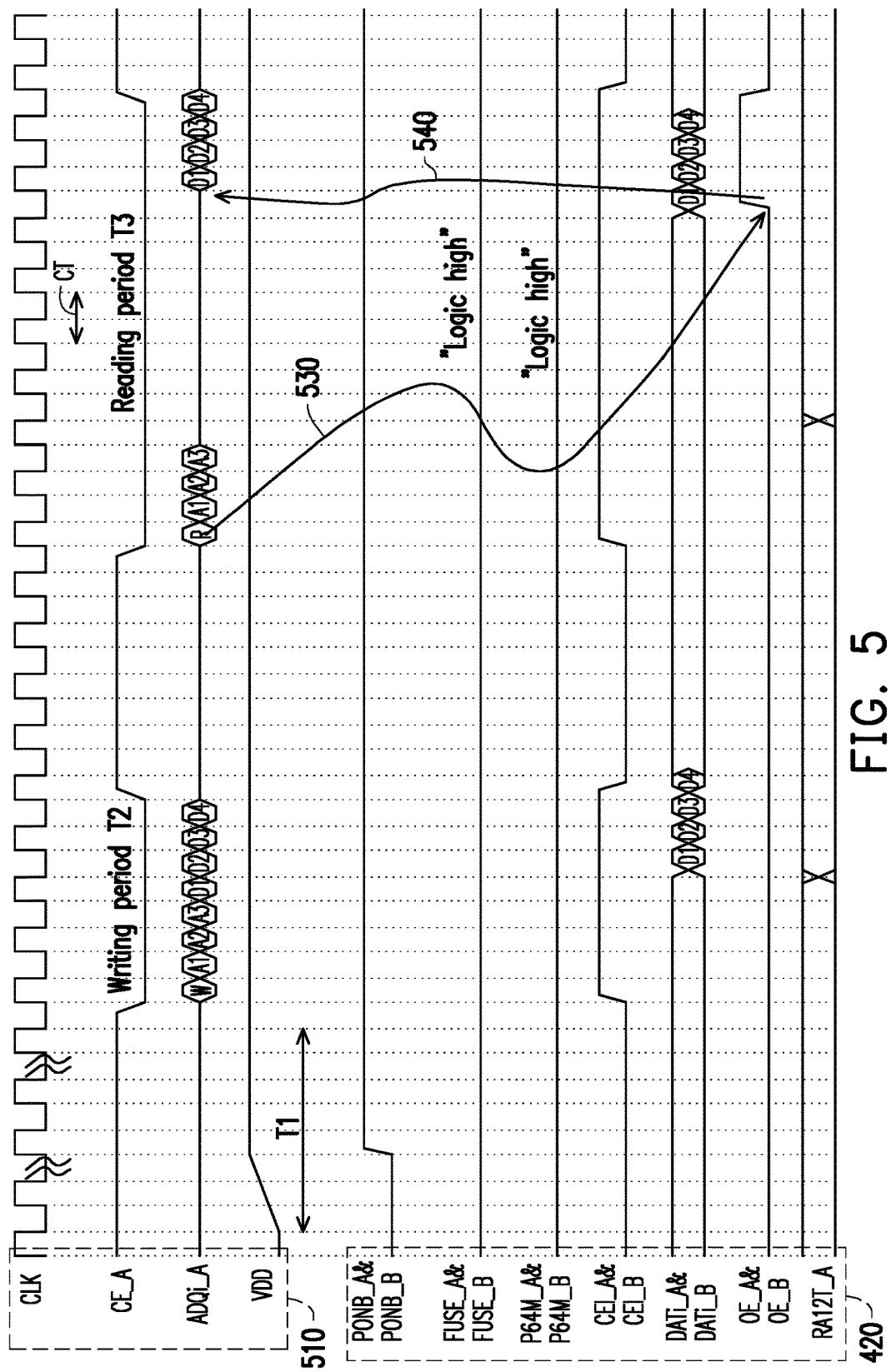
FIG. 5 is a waveform diagram illustrating operations of a first signal buffer and a second signal buffer when the scribe line is not cut according an embodiment of the invention.

FIG. 4 is a waveform diagram illustrating operations of the first signal buffer 114 and the second signal buffer 124 when the scribe line SL is cut according an embodiment of the invention. FIG. 5 is a waveform diagram illustrating operations of the first signal buffer 114 and the second signal buffer 124 when the scribe line SL is not cut according an embodiment of the invention. FIG. 4 and FIG. 5 illustrate multiple signal waveforms when the scribe line SL is cut or the scribe line SL is not cut. The clock signal CLK, the first and second access signals CE_A and CE_B, memory data access signals ADQi_A and ADQi_B and the power voltage VDD belong to an external signal 410. The clock signal CLK, the first access signal CE_A, the memory data access signal ADQi_A and the power voltage VDD are located in the first pads 116 of FIG. 1, and the clock signal CLK, the second access signal CE_B, the memory data access signal ADQi_B and the power voltage VDD are located in the second pads 126 of FIG. 1.

The first and second activate signals PONB_A and PONB_B, the first and second fuse signals FUSE_A and FUSE_B, the first and the second state signals P64M_A and P64M_B, the first and second memory control signals CEI_A and CEI_B, the first and second memory data signals DATi_A and DATi_B, the first and second output enable signals OE_A and OE_B and the memory switch signal RA12T_A belong to an internal signal 420 between the first chip and the second chip. If the connection wire passing through the scribe line SL is not cut, the internal signal 420 is transmitted by the first signal buffer 114 and the second signal buffer 124. A time length between one signal rising and one signal dropping in the clock signal CLK is known as one cycle time CT.

The following refers to FIG. 4 and the circuit structures in FIG. 2 and FIG. 3. Because the scribe line SL is cut, each of the first chip 110 and the second chip 120 in FIG. 1 operates independently for realizing the 32M PSRAM. In a period T1 of an initialization sequence, the first and second fuse signals FUSE_A and FUSE_B are set to "logic low" since the first fuse and the second fuse are not burnt-out, and thus the first and second state signals P64M_A and P64M_B are also at "logic low". In addition, because it is not required to switch between the memory arrays in the first chip and the second chip, the memory switch signal RA12T_A consistently stays at "logic low". The power voltage VDD gradually increases to "logic high" in the period T1 due to power input, and the first and second activate signals PONB_A and PONB_B change from "logic low" to "logic high" only after the power voltage VDD increases to "logic high".

In a writing period T2, the first and second signals CE_A and CE_B change from "logic high" to "logic low", and the first and second activate signals PONB_A and PONB_B are at "logic high" such that the first and second memory control signals CEI_A and CEI_B change from "logic low" to "logic high". A first data entry [W] in the memory data access signals ADQi_A and ADQi_B indicates that, in the writing period T2, the data in the memory data access signals ADQi_A and ADQi_B are respectively stored into the memory arrays of the first chip and the second chip. In other words, data D1 to D4 in the memory data access signals ADQi_A and ADQi_B are transmitted to the memory data signals DATi_A and DATi_B to be respectively stored into the memory arrays of the first chip and the memory arrays of the second chip.

In a reading period T3, the first and second access signals CE_A and CE_B change from "logic high" to "logic low", and the first and second activate signals PONB_A and PONB_B are at "logic high" such that the first and second memory control signals CEI_A and CEI_B change from "logic low" to "logic high". A first data entry [R] in the memory data access signals ADQi_A and ADQi_B indicates that, in the reading period T3, the data stored in the memory arrays of the first chip and the second chip are read through the memory data signals DATi_A and DATi_B after a predetermined period (e.g., at the eighth cycle time after the reading period T3 is enabled), as shown by arrows 430 and 440 in FIG. 4.

The following refers to FIG. 5 and the circuit structure in FIG. 2 and FIG. 3. Since the scribe line SL is not cut, the first chip 110 and the second chip 120 of FIG. 1 operate as a whole, and the internal signal 420 is transmitted through the first signal buffer 114 and the second signal buffer 124 in order to realize the 64M PSRAM. In addition, because the first chip and the second chip shares the first pads, an external signal 510 only includes the first access signal CE_A without having the second access signal CE_B, and only includes the memory data access signal ADQi_A without having the memory data access signal ADQi_B.

In a period T1 of an initialization sequence, the first and second fuse signals FUSE_A and FUSE_B are set to "logic high" since the first fuse and the second fuse are burnt-out, and thus the first and second state signals P64M_A and P64M_B are also at "logic high". In addition, because it is required to switch between the memory arrays in the first chip and the second chip, the memory switch signal RA12T_A may be adjusted to "logic low" or "logic high" based on actual situation so as to access the memory arrays in the first chip or the second chip. The power voltage VDD gradually increases to "logic high" in the period T1 due to power input, and the first and second activate signals PONB_A and PONB_B change from "logic low" to "logic high" only after the power voltage VDD increases to "logic high".

In a writing period T2, operating principles of the first access signal CE_A, the first and second activate signals PONB_A and PONB_B and the first and second memory control signals CEI_A and CEI_B are identical to those of FIG. 4. It should be noted that, because the first and second fuse signals FUSE_A and FUSE_B are both at "logic high", the first memory control signal CEI_A and the second memory control signal CEI_B are both identical to the first access signal CE_A. A first data entry [W] in the memory data access signals ADQi_A and ADQi_B indicates that, in the writing period T2, the data in the memory data access signal ADQi_A are stored into the memory arrays of the first chip and the second chip, and whether the data D1 to D4 are written into the memory arrays of the first chip or the memory arrays of the second chip is determined by the memory switch signal RA12T_A. In other words, the data D1 to D4 in the memory data access signals ADQi_A and ADQi_B are transmitted to one of the memory data signals DATi_A and DATi_B to be stored into the memory arrays of the first chip or the memory arrays of the second chip.

In a reading period T3, operating principles of the first access signal CE_A, the first and second activate signals PONB_A and PONB_B and the first and second memory control signals CEI_A and CEI_B are identical to those of FIG. 4. A first data entry [R] in the memory data access signal ADQi_A indicates that, in the reading period T3, whether the data stored in the memory arrays of the first chip or the second chip are read through the memory data signals DATi_A or DATi_B is selected according to the memory switch signal RA12T_A after a predetermined period (e.g., at the eighth cycle time after the reading period T3 is enabled), as shown by arrows 530 and 540 in FIG. 5.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
a first chip, comprising a first memory array, a first signal buffer and a plurality of first pads; and
a second chip, comprising a second memory array, a second signal buffer and a plurality of second pads, the second signal buffer being coupled to the first signal buffer in the first chip by at least one connection wire, the at least one connection wire passing through a scribe line between the first chip and the second chip,
wherein when the scribe line between the first chip and the second chip is not cut, signals are transmitted between the first signal buffer and the second signal buffer via the at least one connection wire, and the first memory array and the second memory array are commonly connected to the first pads and not connected to the second pads.

2. The memory device of claim 1, wherein a location of the scribe line is different from a disposed location of the first pads and a disposed location of the second pads.

3. The memory device of claim 1, wherein when the scribe line between the first chip and the second chip is cut, the first memory array in the first chip is connected to the first pads, and the second memory array in the second chip is connected to the second pads.

4. The memory device of claim 1, wherein the first signal buffer comprises a first input buffer, an output terminal of the first input buffer generates a first memory control signal for controlling the first memory array,
the second signal buffer comprises a second input buffer, and an output terminal of the second input buffer generates a second memory control signal for controlling the second memory array,
the first input buffer is coupled to an input connection wire by a first input buffer terminal, and the second input buffer is coupled to the input connection wire by a second input buffer terminal,
wherein when the scribe line between the first chip and the second chip is not cut, the first input buffer determines to transmit a first access signal to the first input buffer terminal according to a first fuse signal, and the second input buffer determines to transmit the first access signal transmitted by the input connection wire from the second input buffer terminal to the output terminal of the second input buffer according to a second fuse signal, such that the first memory control signal and the second memory control signal are both identical to the first access signal,
wherein the first access signal is transmitted to the first input buffer via the first pads.

5. The memory device of claim 4, wherein when the scribe line between the first chip and the second chip is cut, the first input buffer transmits the first access signal received by the first pads to the output terminal of the first input buffer,
and the second input buffer transmits a second access signal received by the second pads to the output terminal of the second input buffer.

6. The memory device of claim 4, wherein the first input buffer comprises:
a first logic circuit, having a first terminal receiving a first activate signal and a second terminal of the first logic circuit receiving the first access signal, the first logic circuit comprising:
a first NAND gate, having a first terminal coupled to the first activate signal and a second terminal coupled to a power voltage; and
a first NOR gate, having a first terminal coupled to the first access signal, a second terminal coupled to an output terminal of the first NAND gate and an output terminal of the first NOR gate serving as an output terminal of the first logic circuit;
a first input switch, having a first terminal coupled to the output terminal of the first logic circuit, a second terminal of the first input switch coupled to the first input buffer terminal and a control terminal of the first input switch receiving the first fuse signal to determine whether to interconnect the first terminal and the second terminal of the first input switch, the first input switch comprising:
a first inverter, having an input terminal receiving the first fuse signal and an output terminal generating the first fuse signal being inversed;
a second inverter, having an input terminal coupled to the output terminal of the first inverter;
a first N-type transistor, having a control terminal coupled to an output terminal of the second inverter, a first terminal coupled to the output terminal of the first logic circuit and a second terminal coupled to the first input buffer terminal; and
a first P-type transistor, having a control terminal coupled to the output terminal of the first inverter, a first terminal coupled to the output terminal of the first logic circuit and a second terminal coupled to the first input buffer terminal;
a first buffer circuit, having an input terminal coupled to the output terminal of the first logic circuit and an output terminal of the first buffer circuit serving as the output terminal of the first input buffer, the first buffer circuit comprising:
a second N-type transistor, having a control terminal receiving the power voltage and a first terminal coupled to the output terminal of the first logic circuit;
a second P-type transistor, having a control terminal connected to ground, a first terminal coupled to the output terminal of the first logic circuit and a second terminal coupled to a second terminal of the second N-type transistor;
a third inverter, having an input terminal coupled to a second terminal of the second N-type transistor; and
a fourth inverter, having an input terminal coupled to an output terminal of the third inverter and an output terminal of the fourth inverter serving as the output terminal of the first input buffer.

7. The memory device of claim 5, wherein the second input buffer comprises:
a second logic circuit, having a first terminal receiving a second activate signal and a second terminal of the second logic circuit receiving the second access signal, the second logic circuit comprising:
- a second NAND gate, having a first terminal receiving the second activate signal and a second terminal coupled to an output terminal of the second logic circuit; and
- a second NOR gate, having a first terminal coupled to the second access signal, a second terminal coupled to an output terminal of the second NAND gate and an output terminal of the second NOR gate serving as the output terminal of the second logic circuit;

a second input switch, having a first terminal coupled to an output terminal of the second logic circuit, a second terminal of the second input switch coupled to the second input buffer terminal and a control terminal of the second input switch receiving the second fuse signal for selectively interconnecting the first terminal of the second input switch and an output terminal of the second input switch or interconnecting the second terminal of the second input switch and the output terminal of the second input switch, the second input switch comprising:
- a fifth inverter, having an input terminal receiving the second fuse signal and an output terminal generating the second fuse signal being inversed;
- a sixth inverter, having an input terminal coupled to the output terminal of the fifth inverter;
- a third N-type transistor, having a control terminal coupled to an output terminal of the sixth inverter, a first terminal coupled to the second input buffer terminal and a second terminal coupled to the output terminal of the second input switch;
- a third P-type transistor, having a control terminal coupled to the output terminal of the fifth inverter, a first terminal coupled to the second input buffer terminal and a second terminal coupled to the output terminal of the second input switch;
- a fourth N-type transistor, having a control terminal coupled to the output terminal of the fifth inverter, a first terminal coupled to the output terminal of the second logic circuit and a second terminal coupled to the output terminal of the second input switch; and
- a fourth P-type transistor, having a control terminal coupled to the output terminal of the sixth inverter, a first terminal coupled to the output terminal of the second logic circuit and a second terminal coupled to the output terminal of the second input switch; and a second buffer circuit, having an input terminal coupled to the output terminal of the second input switch and an output terminal of the second buffer circuit coupled to the output terminal of the second input buffer, the second buffer circuit comprising:
- a seventh buffer circuit, having an input terminal coupled to the output terminal of the second input switch; and
- an eighth inverter, having an input terminal coupled to an output terminal of the seventh inverter and an output terminal of the eighth inverter coupled to the output terminal of the second input buffer.

8. The memory device of claim 1, wherein the first signal buffer comprises a first output buffer, an output terminal of the first output buffer provides a first memory data signal to the first pads, the second signal buffer comprises a second output buffer, and an output terminal of the second output buffer provides a second memory data signal to the second pads, the first output buffer is coupled to an output connection wire by a first output buffer terminal, and the second output buffer is coupled to the output connection wire by a second output buffer terminal, wherein when the scribe line between the first chip and the second chip is not cut, the second output buffer determines to transmit the second memory data signal to the second input buffer terminal according to a second fuse signal, and the first output buffer determines to transmit the first memory data signal or the second memory data signal transmitted by the output connection wire to the output terminal of the first output buffer according to a first fuse signal and a memory switch signal.

9. The memory device of claim 8, wherein when the scribe line between the first chip and the second chip is cut, the first output buffer transmits the first memory data signal to the first pads, and the second output buffer transmits the second memory data signal to the second pads.

10. The memory device of claim 8, wherein the first output buffer comprises:
- a third logic circuit, having a first terminal receiving the memory switch signal and a second terminal of the third logic circuit receiving a first state signal corresponding to the first fuse signal, the third logic circuit comprising:
  - a third NAND gate, having a first terminal receiving the memory switch signal and a second terminal of the third NAND gate receiving the first state signal corresponding to the first fuse signal; and
  - a ninth inverter, having an input terminal coupled to an output terminal of the third NAND gate;
- a first output switch, having a first terminal receiving the first memory data signal, a second terminal of the first output switch coupled to the first output buffer terminal and a control terminal of the first output switch coupled to an output terminal of the third logic circuit for selectively interconnecting the first terminal of the first output switch and an output terminal of the first output switch or interconnecting the second terminal of the first output switch and the output terminal of the first output switch, the first output switch comprising:
  - a fifth N-type transistor, having a control terminal coupled to the output terminal of the third NAND gate, a first terminal receiving the first memory data signal and a second terminal coupled to the output terminal of the first output switch;
  - a fifth P-type transistor, having a control terminal coupled to an output terminal of the ninth inverter, a first terminal receiving the first memory data signal and a second terminal coupled to the output terminal of the first output switch;
  - a sixth N-type transistor, having a control terminal coupled to the output terminal of the ninth inverter, a first terminal coupled to the output terminal of the first output switch and a second terminal coupled to the first output buffer terminal; and
  - a sixth P-type transistor, having a control terminal coupled to the output terminal of the third NAND gate, a first terminal coupled to the output terminal of the first output switch and a second terminal coupled to the first output buffer terminal; and
- a first output stage circuit, having an input terminal coupled to the output terminal of the first output switch, a control terminal of the first output stage circuit receiving a first output enable signal and an output terminal of the first output stage circuit serving as an output terminal of the first output buffer, the first output stage circuit comprising:
- a fourth NAND gate, having a first terminal receiving the first output enable signal and a second terminal receiving a power voltage;
- a tenth inverter, having an input terminal coupled to an output terminal of the fourth NAND gate;
- a fifth NAND gate, having a first terminal coupled to the output terminal of the first output switch and a second terminal coupled to an output terminal of the tenth inverter;
- a third NOR gate, having a first terminal coupled to the output terminal of the first output switch and a second terminal coupled to the output terminal of the fourth NAND gate;
- a seventh N-type transistor, having a first terminal coupled to the output terminal of the first output stage circuit, a second terminal connected to ground and a control terminal coupled to an output terminal of the third NOR gate; and
- a seventh P-type transistor, having a first terminal coupled to the power voltage, a second terminal coupled to the output terminal of the first output stage circuit and a control terminal coupled to an output terminal of the fifth NAND gate.

11. The memory device of claim 10, wherein the second output buffer comprises:
- a fourth logic circuit, having a first terminal receiving the power voltage and a second terminal of the fourth logic circuit receiving a second state signal corresponding to the second fuse signal, the fourth logic circuit comprising:
  - a sixth NAND gate, having a first terminal receiving the power voltage and a second terminal of the sixth NAND gate receiving the second state signal corresponding to the second fuse signal; and
  - an eleventh inverter, having an input terminal coupled to an output terminal of the sixth NAND gate;
- a second output switch, having a first terminal receiving the second memory data signal, a second terminal of the second output switch coupled to the second output buffer terminal and a control terminal of the second output switch coupled to an output terminal of the fourth logic circuit for selectively interconnecting the first terminal of the second output switch and an output terminal of the second output switch or interconnecting the first terminal of the second output switch and the second terminal of the second output switch, wherein when the first terminal and the second terminal of the second output switch are interconnected, the second output switch connects the output terminal of the second output switch to ground, and the second output switch comprises:
  - an eighth N-type transistor, having a control terminal coupled to an output terminal of the eleventh inverter, a first terminal coupled to the second output buffer terminal and a second terminal receiving the second memory data signal;
  - an eighth P-type transistor, having a control terminal coupled to the output terminal of the sixth NAND gate, a first terminal coupled to the second output buffer terminal and a second terminal receiving the second memory data signal;
- a ninth N-type transistor, having a control terminal coupled to the output terminal of the sixth NAND gate, a first terminal receiving the second memory data signal and a second terminal coupled to the output terminal of the second output switch;
- a ninth P-type transistor, having a control terminal coupled to the output terminal of the eleventh inverter, a first terminal receiving the second memory data signal and a second terminal coupled to the output terminal of the second output switch; and
- a tenth P-type transistor, having a control terminal coupled to the output terminal of the sixth NAND gate, a first terminal coupled to the output terminal of the second output switch and a second terminal connected to ground; and
- a second output stage circuit, having an input terminal coupled to the output terminal of the second output switch, a control terminal of the second output stage circuit receiving a second output enable signal and an output terminal of the second output stage circuit serving as the output terminal of the second output buffer, the second output stage circuit comprising:
  - a seventh NAND gate, having a first terminal receiving the second output enable signal and a second terminal receiving the second state signal;
  - a twelfth inverter, having an input terminal coupled to an output terminal of the seventh NAND gate;
  - an eighth NAND gate, having a first terminal coupled to the output terminal of the second output switch and a second terminal coupled to an output terminal of the twelfth inverter;
  - a fourth NOR gate, having a first terminal coupled to the output terminal of the second output switch and a second terminal coupled to the output terminal of the seventh NAND gate;
  - an eleventh N-type transistor, having a first terminal coupled to the output terminal of the second output stage circuit, a second terminal connected to ground and a control terminal coupled to an output terminal of the fourth NOR gate; and
  - an eleventh P-type transistor, having a first terminal coupled to the power voltage, a second terminal coupled to the output terminal of the second output stage circuit and a control terminal coupled to an output terminal of the eighth NAND gate.

12. The memory device of claim 4, wherein the first chip further comprises:
- a first fuse, coupled to the first signal buffer, the first fuse providing the first fuse signal according to a fusing state of the first fuse, wherein the second chip further comprises:
- a second fuse, coupled to the second signal buffer, the second fuse providing the second fuse signal according to a fusing state of the second fuse, wherein when the scribe line between the first chip and the second chip is not cut, the fusing states of the first fuse and the second fuse are cut-off, and the first fuse and the second fuse are at logic high, wherein when the scribe line between the first chip and the second chip is cut, the fusing states of the first fuse and the second fuse are turned-on, and the first fuse and the second fuse are at logic low.

* * * * *